(12) United States Patent
Chen

(10) Patent No.: US 6,787,813 B2
(45) Date of Patent: Sep. 7, 2004

(54) SUBSTRATE EXPOSURE APPARATUS

(75) Inventor: Kuo-Tso Chen, Hsinchu (TW)

(73) Assignee: Via Technologies, Inc., Taipei Hsien (TW)

( * ) Notice: Subject to any disclaimer, the term of this patent is extended or adjusted under 35 U.S.C. 154(b) by 132 days.

(21) Appl. No.: 10/112,266

(22) Filed: Mar. 27, 2002

(65) Prior Publication Data
US 2003/0107059 A1 Jun. 12, 2003

(30) Foreign Application Priority Data
Dec. 10, 2001 (TW) .................................... 90130499 A

(51) Int. Cl.$^7$ ............................................. H01L 33/00
(52) U.S. Cl. ........................... 257/98; 438/942; 430/30; 430/5

(58) Field of Search ........................... 257/98; 438/942; 430/30, 5

(56) References Cited

U.S. PATENT DOCUMENTS

| | | | | |
|---|---|---|---|---|
| 5,082,755 A | * | 1/1992 | Liu ................................ | 430/5 |
| 5,666,261 A | * | 9/1997 | Aguilera ...................... | 361/681 |
| 6,407,723 B1 | * | 6/2002 | Okuno et al. ................ | 345/3.2 |

* cited by examiner

Primary Examiner—Luan Thai
(74) Attorney, Agent, or Firm—J. C. Patents

(57) ABSTRACT

A substrate exposure apparatus, having a display apparatus and a control system. The display apparatus is used to display the pattern and to transfer the pattern to the photoresist, and includes a non-self luminescent display or a self-luminescent display. The control system is used to control the pattern displayed on the display apparatus.

29 Claims, 2 Drawing Sheets

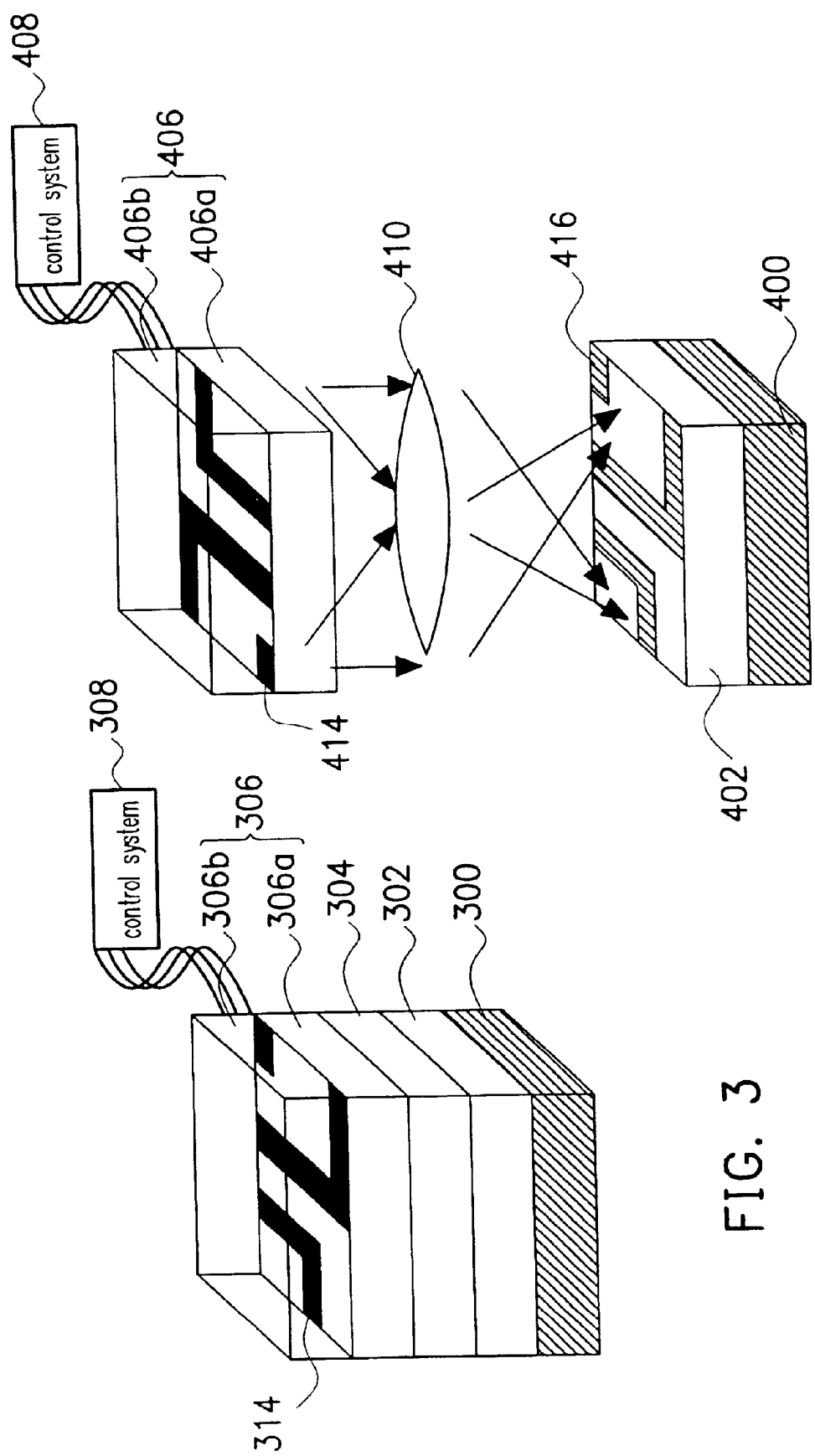

SUBSTRATE EXPOSURE APPARATUS

CROSS-REFERENCE TO RELATED APPLICATION

This application claims the priority benefit of Taiwan application serial no. 90130499, filed Dec. 10, 2001.

BACKGROUND OF THE INVENTION

1. Field of the Invention

The invention relates in general to a substrate exposure apparatus, and more particularly, to a substrate exposure apparatus that uses a display apparatus to directly perform exposure on the photoresist.

2. Description of the Related Art

Photolithography process is one of the crucial steps in the IC substrate, printed circuit board, and semiconductor fabrication process. In wafer fabrication, the patterned and doped regions for each thin film layer are determined by photolithography process. Also, the formation of metal film patterns in printed circuit board and IC substrate are determined by photolithography process. And, for each one, the photomask must be well prepared. In photolithography process, after some preparation process, the photoresist is coated on the substrate and soft bake and hard bake are further performed. After the photoresist is cured, the steps of exposure and development are performed to transfer the pattern of the photomask to the photoresist.

Referring to FIG. 1, a conventional photolithography process that uses a contact mode photomask to transfer the pattern to the photoresist is schematically shown. A substrate 100, on which a circuit, dielectric layer, dielectric pattern or conductive layer may have been formed, is provided. A photoresist 102 is formed on the substrate 100. A photomask 110 is disposed on the photoresist 102. To protect the surface of the photomask 110, a protect film 104 is placed between and separates the photomask 110 and the photoresist 102. The protect film 104 is in contact with both the surface of the photomask 110 and the photoresist 102. By radiation of a light source 112, an exposure step is performed on the photoresist 102, so that the pattern of the photomask 110 is transferred to the photoresist 102.

The conventional contact mode photomask 110 includes formation of a patterned blocking layer 108 on a surface of a transparent substrate 106. To protect the photomask 110, the protect film 104 sandwiched between the photomask substrate 106 and the photoresist 102 is in contact with both surfaces of the photomask substrate 106 and the photoresist 102. The patterned blocking layer 108 of the photomask 110 blocks the light source 112 to determine the pattern on the photoresist 102 to be radiated.

Referring to FIG. 2, a conventional photolithography process using a non-contact mode photomask to transfer a pattern to a photoresist is schematically shown. A substrate 200 on which a photoresist 202 is formed is provided. Circuits, dielectric layers, dielectric patterns or conductive layers may have been formed on the substrate 200. A photomask 210 is located above the photoresist 202. A lens set 214 is disposed between the photomask 210 and the photoresist 202. By radiation of a light source 212, the photoresist 202 is exposed, and the pattern of the photomask 210 is transferred to the photoresist 202.

The conventional non-contact mode photomask is constructed by forming a patterned blocking layer 208 on a transparent substrate 206. The patterned blocking layer 208 on the transparent substrate 206 blocks the light source to determine the pattern of the photoresist 202 to be radiated. In a non-contact mode, the pattern of the photomask 210 is transferred to the photoresist 202 by the lens set 214.

The fabrication of the conventional photomask is very time consuming and costly. The photomask has to be kept in an appropriate environment, and the maintenance cost is also high.

In addition, the pattern of the photomask cannot be modified. When the circuit design of the wafer or printed circuit board requires a modification, a new photomask has to be fabricated.

SUMMARY OF THE INVENTION

The present invention provides a substrate exposure apparatus that does not require a photomask. The fabrication cost and maintenance cost of a photomask in the photolithography process are thus saved.

The present invention further provides a patternable substrate exposure apparatus, in which the displayed pattern is easily modified according to the required exposure pattern. The substrate exposure apparatus can thus be iteratively used.

The substrate exposure apparatus provided by the present invention comprises a display apparatus and a control system. The display apparatus is used to display the pattern to be transferred to the photoresist. The control system is used to control the pattern displayed by the display apparatus.

In the substrate exposure apparatus provided by the present invention, the display apparatus comprises a non-self luminescent display such as a liquid crystal display (LCD) or a self-luminescent display such as an organic light emitting diode display (OLED), a polymer light emitting diode display (PLED), a plasma display panel (PDP) and a field emission display (FED). The above liquid crystal display further comprises a non-self luminescent liquid crystal display panel and a light source module to provide the exposure light source.

In the present invention, the substrate exposure apparatus performs a contact mode or a non-contact mode exposure process. A protect film is used in contact with the photoresist in the contact mode substrate exposure apparatus. A lens set is selectively located between the display apparatus and the photoresist in the non-contact mode substrate exposure apparatus.

Both the foregoing general description and the following detailed description are exemplary and explanatory only and are not restrictive of the invention, as claimed.

BRIEF DESCRIPTION OF THE DRAWINGS

FIG. 3 is a schematic drawing of a contact mode substrate exposure apparatus provided in one embodiment of the present invention; and FIG. 4 is a schematic drawing of a non-contact mode substrate exposure apparatus provided in another embodiment of the present invention.

DESCRIPTION OF THE PREFERRED EMBODIMENTS

Figure 2:
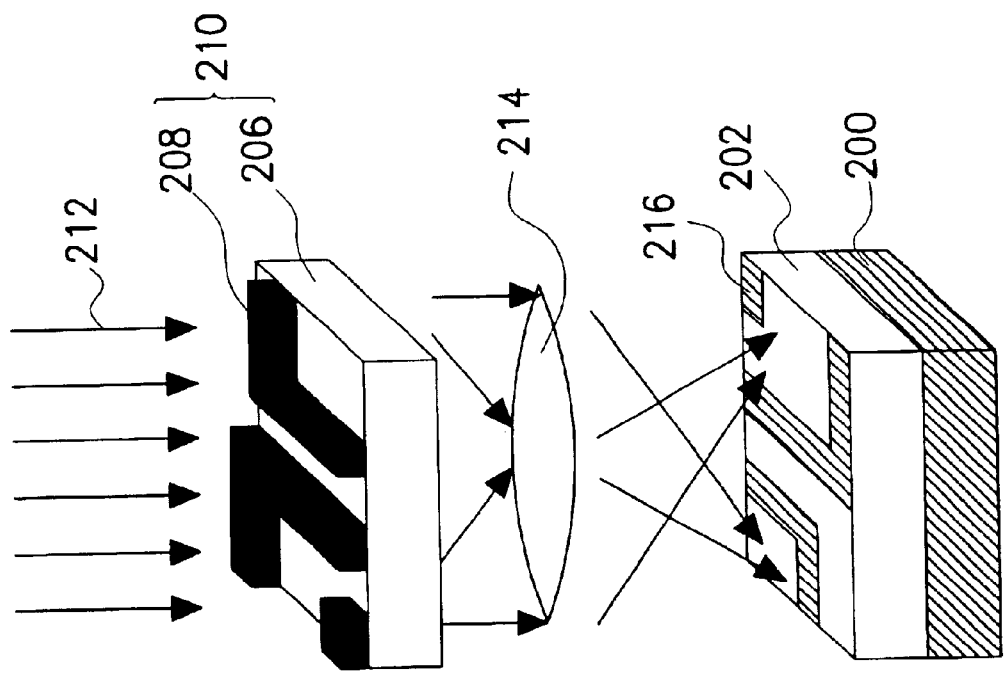
FIG. 2 is a schematic drawing of a conventional photolithography process to transfer a pattern from a non-contact mode photomask to a photoresist.
Figure 1:
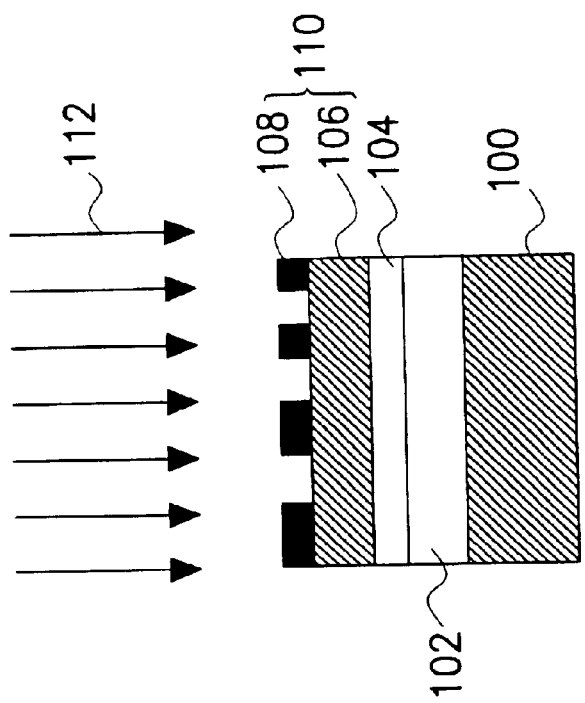
FIG. 1 is a schematic drawing of a conventional photolithography process to transfer a pattern from a contact mode photomask to a photoresist.

Referring to FIG. 3, a schematic drawing of a contact mode substrate exposure apparatus in one embodiment of the invention is shown. Before performing an exposure process, a substrate 300 is provided. A photoresist 302 is formed on the substrate 300. The substrate 300 includes an integrated circuit (IC) substrate with or without circuit formed thereon, a printed circuit board (PCB) or various types of package substrates. The contact mode substrate exposure apparatus includes a display apparatus 306 and a control system 308. The display apparatus includes a non-self luminescent display such as a liquid crystal display or a self-luminescent display such as an organic light emitting diode display, a polymer light emitting diode display, a plasma display panel, or a field emission display. The control system 308 is used to control a pattern 314 displayed on the display apparatus 308.

In this embodiment, the display apparatus 306 includes a liquid crystal display panel 306a and a backlight module 306b. The backlight module 306b is located on one surface of the liquid crystal display panel 306a as an exposure light source. Alternatively, a sidelight module may also be adopted as the light source module. As the liquid crystal display panel 306a is a light valve itself, by controlling the arrangement status of the liquid crystal molecules on each pixel via the control system 308, the pattern 314 is formed on the liquid crystal display panel 306a. After traveling through the liquid crystal display panel 306a, the light beam emitted by the backlight module 306b is incident on the photoresist 302 for exposure.

In addition, as the display apparatus 306 is in contact with the photoresist 302 on the substrate 300, a protect film 304 is formed to allow the liquid crystal display panel 306a to be in contact with the photoresist 302 on the substrate 300 thereby.

The above liquid crystal display panel 306a uses the protect film 304 to contact with the photoresist 302 on the substrate 300, so as to perform exposure. This is equivalent to transfer of the pattern from the contact mode photomask to the photoresist in the prior art. Typically, the pattern 314 displayed on the liquid crystal display panel 306a is transferred to the photoresist 302 with a ratio of 1:1 using the contact mode substrate exposure apparatus.

For convenience of description, the embodiment only uses the liquid crystal display as an example for the display apparatus 306. It is appreciated that application of the display apparatus 306 is not limited to liquid crystal display only. Self-luminescent display can also be used as the display apparatus. The application of the self-luminescent display does not require the light source module to provide the exposure light source since the display panel is able to provide the exposure light source itself.

Referring to FIG. 4, a schematic drawing of a non-contact mode substrate exposure apparatus in one embodiment of the invention is shown. Before performing an exposure process, a substrate 400 is provided. A photoresist 402 is formed on the substrate 400. The substrate 400 includes an integrated circuit (IC) substrate with or without circuit formed thereon, a printed circuit board (PCB) or various types of package substrates. The non-contact mode substrate exposure apparatus includes a display apparatus 406 and a control system 408. The display apparatus includes a non-self luminescent display such as a liquid crystal display or a self-luminescent display such as organic light emitting diode display, a polymer light emitting diode display, a plasma display panel, or a field emission display. The control system 408 is used to control a pattern 414 displayed on the display apparatus 408.

In this embodiment, the display apparatus 406 includes a liquid crystal display panel 406a and a backlight module 406b. The backlight module 406b is located on one surface of the liquid crystal display panel 406a as an exposure light source. Alternatively, a sidelight module may also be adopted as the light source module. As the liquid crystal display panel 406a is a light valve itself, by controlling the arrangement status of the liquid crystal molecules on each pixel via the control system 408, the pattern 414 is formed on the liquid crystal display panel 406a. After traveling through the liquid crystal display panel 406a, the light beam emitted by the backlight module 406b is incident on the photoresist 402 for exposure.

In addition, a lens set 410 is located between the display apparatus 406 and the photoresist 402 on the substrate 400. The lens set 410 performs minification, magnification, focus and defocus processes to form the pattern 416. For the current technique, black matrix (BM), that causes a problem in pattern resolution by shielding light, is allocated between pixels of the liquid crystal display panel 406a, so that the process yield is affected. In the embodiment, the multiple exposure with small location shift between each exposure could expose the shielding area at second, third or fourth exposure, where the small location shift could be provided by the moving of substrate, the moving of some components of lens set, or the moving of display apparatus. Also, the allocation of the lens set 410 and an appropriate defocusing process can overcome such problem.

The above transmission type display apparatus 406 allows the exposure process to be performed in a non-contact mode, which is equivalent of the conventional non-contact mode photomask, by which the pattern is transferred to the photoresist on the substrate. Such non-contact mode substrate exposure apparatus allows the pattern 414 on the liquid crystal display panel 406a to be transferred to the photoresist 402 with a proportional magnification or minification.

For convenient descriptions, the embodiment of the invention only uses the liquid crystal display panel as an example for the display apparatus 406. However, the display apparatus 406 is not limited to the liquid crystal display panel. It can also includes a self-luminescent display. The self-luminescent display needs not to be implemented with a light source module, which is usually used to provide the exposure light source, because the displaying panel by itself can also provide the exposure light source.

Both the contact mode (FIG. 3) and the non-contact mode (FIG. 4) substrate exposure apparatus can be applied to the routing process of a printed circuit board and fabrication of patterned thin film layer of integrated circuit.

According to the above, the substrate exposure apparatus has at least the following advantages.

1. The substrate exposure apparatus does not only directly transfer various patterns to the photoresist and save the time consumed for fabricating the photomask significantly, but also allows an easier automatic mass production of integrated circuits.

2. A variety of patterns can be transferred to the photoresist by the substrate exposure apparatus without fabricating the respective photomask for each of the patterns, so that the fabrication cost is greatly reduced.

3. The process for changing photomasks in the prior art is waived, so that the pollution and process variation caused thereby are avoided.

4. The relative positions of the display panel and the optical positioning system are fixed, so that photomask positioning problem in the prior art is resolved.

5. The pattern for exposure is generated in a real time. Therefore, real time design modification and alteration are possible. It is thus advantageous for versatile product design of each individual customer and the versatile product customized design.

6. The cost and maintenance expenses for the current photomasks are saved.

Other embodiments of the invention will appear to those skilled in the art from consideration of the specification and practice of the invention disclosed herein. It is understood that the specification and examples are to be considered as exemplary only, with a true scope and spirit of the invention being indicated by the following claims.

What is claimed is:

1. A substrate exposure apparatus, applicable to transfer a pattern to a photoresist on a surface of a substrate, the substrate exposure apparatus comprising:
    a display apparatus, to display the pattern and to transfer the pattern to the photoresist, wherein the display apparatus uses a protect film to contact the photoresist; and
    a control system, to control the pattern displayed on the display apparatus.

2. The substrate exposure apparatus according to claim 1, wherein the substrate includes an integrated circuit substrate.

3. The substrate exposure apparatus according to claim 1, wherein the substrate includes a printed circuit board.

4. The substrate exposure apparatus according to claim 1, wherein the substrate includes various types of package substrates.

5. The substrate exposure apparatus according to claim 1, wherein the display apparatus includes a non-self luminescent display.

6. The substrate exposure apparatus according to claim 5, wherein the non-self luminescent display includes a non-self luminescent display panel and a light source module, which provides an exposure light source.

7. The substrate exposure apparatus according to claim 6, wherein the non-luminescent display panel includes a liquid crystal display panel.

8. The substrate exposure apparatus according to claim 6, wherein the light source module includes a backlight source.

9. The substrate exposure apparatus according to claim 6, wherein the light source module includes a sidelight source.

10. The substrate exposure apparatus according to claim 1, wherein the display apparatus includes a self-luminescent display.

11. The substrate exposure apparatus according to claim 10, wherein the self-luminescent display includes an organic light emitting diode display.

12. The substrate exposure apparatus according to claim 10, wherein the self-luminescent display includes a polymer light emitting diode display.

13. The substrate exposure apparatus according to claim 10, wherein the self-luminescent display includes a plasma display panel.

14. The substrate exposure apparatus according to claim 10, wherein the self-luminescent display includes a field emission display.

15. The substrate exposure apparatus according to claim 1, wherein a lens set is located between the display apparatus and the photoresist.

16. A substrate exposure apparatus, applicable to transfer a pattern to a photoresist on a surface of a substrate, the substrate exposure apparatus comprising:
    a display apparatus, to display the pattern and to transfer the pattern to the photoresist, wherein the substrate includes an integrated circuit substrate; and
    a control system, to control the pattern displayed on the display apparatus.

17. The substrate exposure apparatus according to claim 16, wherein the integrated circuit substrate is selected from a group consisting of a printed circuit board and various types of package substrates.

18. The substrate exposure apparatus according to claim 16, wherein the display apparatus includes a non-self luminescent display.

19. The substrate exposure apparatus according to claim 18, wherein the non-self luminescent display includes a non-self luminescent display panel and a light source module, which provides an exposure light source.

20. The substrate exposure apparatus according to claim 19, wherein the light source module includes a backlight source.

21. The substrate exposure apparatus according to claim 19, wherein the light source module includes a sidelight source.

22. The substrate exposure apparatus according to claim 18, wherein the non-luminescent display panel includes a liquid crystal display panel.

23. The substrate exposure apparatus according to claim 16, wherein the display apparatus includes a self-luminescent display.

24. The substrate exposure apparatus according to claim 23, wherein the self-luminescent display includes an organic light emitting diode display.

25. The substrate exposure apparatus according to claim 23, wherein the self-luminescent display includes a polymer light emitting diode display.

26. The substrate exposure apparatus according to claim 23, wherein the self-luminescent display includes a plasma display panel.

27. The substrate exposure apparatus according to claim 23, wherein the self-luminescent display includes a field emission display.

28. The substrate exposure apparatus according to claim 16, wherein the display apparatus uses a protect film to contact with the photoresist.

29. The substrate exposure apparatus according to claim 16, wherein a lens set is located between the display apparatus and the photoresist.

* * * * *